United States Patent
Rachamadugu et al.

(10) Patent No.: US 8,441,842 B2
(45) Date of Patent: May 14, 2013

(54) MEMORY DEVICE HAVING MEMORY CELLS WITH ENHANCED LOW VOLTAGE WRITE CAPABILITY

(75) Inventors: Vinod Rachamadugu, Kurnool (IN);
Setti Shanmukheswara Rao, Bangalore (IN); Satisha Nanjunde Gowda, Hassan (IN)

(73) Assignee: LSI Corporation, Milpitas, CA (US)

( * ) Notice: Subject to any disclaimer, the term of this patent is extended or adjusted under 35 U.S.C. 154(b) by 193 days.

(21) Appl. No.: 12/974,441

(22) Filed: Dec. 21, 2010

(65) Prior Publication Data

US 2012/0155151 A1 Jun. 21, 2012

(51) Int. Cl.
*G11C 11/34* (2006.01)
(52) U.S. Cl.
USPC ............................................. 365/154
(58) Field of Classification Search .......... 365/154, 365/189.16, 189.11, 226
See application file for complete search history.

(56) References Cited

U.S. PATENT DOCUMENTS

| | | | | |
|---|---|---|---|---|
| 7,447,058 B2* | 11/2008 | Maki et al. | | 365/154 |
| 7,502,275 B2* | 3/2009 | Nii et al. | | 365/226 |
| 7,606,061 B2* | 10/2009 | Kengeri et al. | | 365/154 |
| 7,626,853 B1* | 12/2009 | Lih | | 365/154 |
| 7,633,830 B2 | 12/2009 | Evans et al. | | |
| 2007/0109878 A1 | 5/2007 | Gouin et al. | | |
| 2007/0236983 A1* | 10/2007 | Wang et al. | | 365/154 |
| 2009/0016138 A1* | 1/2009 | Bhatia | | 365/226 |
| 2009/0086554 A1 | 4/2009 | Chanussot et al. | | |
| 2009/0109733 A1* | 4/2009 | Wong | | 365/154 |
| 2009/0262594 A1 | 10/2009 | Bhatia | | |
| 2010/0097844 A1 | 4/2010 | Liu | | |
| 2012/0008377 A1* | 1/2012 | Chuang et al. | | 365/154 |

FOREIGN PATENT DOCUMENTS

WO 2009/138739 A2 11/2009

* cited by examiner

*Primary Examiner* — Douglas King
(74) *Attorney, Agent, or Firm* — Ryan, Mason & Lewis, LLP

(57) ABSTRACT

A memory device includes a memory array comprising a plurality of memory cells. At least a given one of the memory cells comprises a pair of cross-coupled inverters and associated write assist circuitry. The write assist circuitry comprises first switching circuitry coupled between a supply node of a device of the first inverter and a supply node of the memory cell, and second switching circuitry coupled between a supply node of a device of the second inverter and the supply node of the memory cell. The first and second switching circuitry are separately controlled such that during a write operation of the memory cell the supply node of one of the devices is connected to the supply node of the memory cell while the supply node of the other device is not connected to the supply node of the memory cell but is instead permitted to float.

20 Claims, 7 Drawing Sheets

MEMORY DEVICE HAVING MEMORY CELLS WITH ENHANCED LOW VOLTAGE WRITE CAPABILITY

FIELD OF THE INVENTION

The present invention relates generally to semiconductor memory devices, and more particularly to techniques for configuring such devices to permit write operations to occur at reduced voltage levels.

BACKGROUND OF THE INVENTION

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

As transistor dimensions continue to shrink, it is becoming increasingly difficult to prevent local mismatch between the memory cell transistors of the memory device. This can adversely impact memory device performance, such as the ability to consistently write data to the memory cells at low voltages. For example, a conventional six-transistor (6T) static random access memory (SRAM) memory cell includes two NMOS pass gate transistors and a pair of cross-coupled inverters, with the two inverters collectively comprising two PMOS pull-up transistors and two NMOS pull-down transistors. In writing data to a conventional SRAM memory cell of this type, the bitline is discharged to a logic low level and the wordline is set to a logic high level. If in a given memory cell, worst case local variations cause the threshold voltage in the NMOS pass gate transistors to increase and the threshold voltage in the PMOS pull-up transistors to decrease, then the NMOS pass gate transistor coupled to the bitline may not be able to drive the corresponding inverter input below its trip point, and the memory cell will not be written with the data. For a memory cell with worst case local variations, at lower write voltages the overdrive of the NMOS pass gate transistor decreases, since the overdrive is given by VGS-VT, where VGS denotes the gate-to-source voltage and VT denotes the threshold voltage. Similarly, at lower write voltages the overdrive of the PMOS pull-up transistor increases, since the overdrive is given by VSG-VT, where VSG denotes the source-to-gate voltage. This reduced overdrive of the NMOS pass-gate transistor reduces its drive current below the required source current of the PMOS pull-up transistor, leading to the above-noted write failures under worst case local variations.

A conventional approach for addressing the above-described problem is to use a boost signal to provide an additional negative voltage to the bitline during the write operation. Thus, when writing to the memory cell, the bitline is discharged to the negative supply voltage VSS, and then the boost signal is enabled to further reduce the bitline voltage below VSS. This approach, which is also referred to as "negative bootstrapping," increases the NMOS pass gate drive such that the inverter input is driven below its trip point, thereby allowing the data to be written to the memory cell under the above-noted worst case condition. An approach of this type is described in U.S. Patent Application Publication No. 2007/0109878, entitled "Memory Device with Improved Writing Capabilities."

However, the negative bootstrapping approach has a number of significant drawbacks. For example, in this approach the bitline negative voltage must be accurately adjusted above the local threshold voltage variation of the NMOS pass gate to ensure smooth write operations, which is very difficult to do in practice, particularly given the presence of variable bitline capacitances across the wide range of rows in a typical embedded memory array. In addition, one must ensure that the additional negative voltage does not cause the bitline junction to become forward biased. This could cause the memory cells in unaccessed rows to turn on at very low voltage, potentially leading to inadvertent overwriting of the data stored in those memory cells.

A possible alternative approach is to utilize a charge pump to provide a separately-controlled VDD supply voltage to the core portion of the memory cell, where the core portion comprises the four inverter transistors in the 6T SRAM cell. During a write operation when the bitline is discharged to a logic low level, the core VDD voltage is reduced below the VDD voltage used for the pass gate transistors. This reduces the required drive current of the PMOS pull-up transistors, ensuring that the NMOS pass gate is able to drive the inverter input below its trip point, thereby allowing the data to be written to the memory cell under the above-noted worst case condition. However, this approach requires accurate charge pump circuitry as well as variable pumping capacitance over the wide range of rows of the memory array, and is therefore increasingly difficult to implement as device dimensions shrink.

It is therefore apparent that a need exists for an improved approach to configuring memory cells for low voltage write operations.

SUMMARY OF THE INVENTION

Illustrative embodiments of the present invention overcome the drawbacks of the conventional approaches described above by providing memory cells in which application of power to respective supply nodes of two cross-coupled inverters of a given memory cell is separately controlled in a manner that ensures accurate low voltage write performance without the need for negative bootstrapping or charge pumps.

In accordance with one aspect of the invention, a memory device includes a memory array comprising a plurality of memory cells. At least a given one of the memory cells comprises a pair of cross-coupled inverters and write assist circuitry. The write assist circuitry comprises first switching circuitry coupled between a supply node of a device of the first inverter and a supply node of the memory cell, and second switching circuitry coupled between a supply node of a device of the second inverter and the supply node of the memory cell. The first and second switching circuitry are separately controlled such that during a write operation of the memory cell the supply node of one of the devices is connected to the supply node of the memory cell while the supply node of the other device is not connected to the supply node of the memory cell but is instead permitted to float.

In one of the illustrative embodiments, the first switching circuitry comprises a first plurality of transistors connected in parallel with one another, with their source and drain terminals coupled between the supply node of the device of the first inverter and the supply node of the memory cell, and the second switching circuitry comprises a second plurality of transistors connected in parallel with one another, with their source and drain terminals coupled between the supply node of the device of the second inverter and the supply node of the memory cell.

In a given implementation of such an embodiment, gate terminals of a first one of the first plurality of transistors and a first one of the second plurality of transistors are coupled to a common control signal terminal, gate terminals of a second one of the first plurality of transistors and a second one of the second plurality of transistors are coupled to a common wordline, and gate terminals of a third one of the first plurality of transistors and a third one of the second plurality of transistors are coupled to respective complemented and uncomplemented bitlines.

During the write operation in this implementation, the first and second transistors of the first and second pluralities of transistors are in their respective off states, the third transistor of the first plurality of transistors is in its off state, and the third transistor of the second plurality of transistors is in its on state, such that the supply node of the device of the second inverter is connected to the supply node of the memory cell by the third transistor of the second plurality of transistors, while the supply node of the device of the first inverter is disconnected from the supply node of the memory cell by the third transistor of the first plurality of transistors.

Advantageously, the illustrative embodiments provide memory cells having an enhanced write assist capability which ensures accurate writing of data to the memory cells at low voltages, while also avoiding any adverse impact to high voltage write operations, read operations, static noise margin or stored data stability. In addition, write cycle time can be reduced by reducing wordline pulse width. Furthermore, the yield of a memory array comprising such memory cells is also improved.

A memory device in accordance with the invention may be implemented, for example, as a stand-alone memory device, such as a packaged integrated circuit, or as an embedded memory in a microprocessor or other processing device.

DETAILED DESCRIPTION OF THE INVENTION

The invention will be illustrated herein in conjunction with exemplary semiconductor memory devices and associated memory cells as well as other related circuitry. It should be understood, however, that the invention is more generally applicable to any semiconductor memory device in which improved low voltage write performance is desired, and may be implemented using circuitry other than that specifically shown and described in conjunction with the illustrative embodiments.

Figure 1:
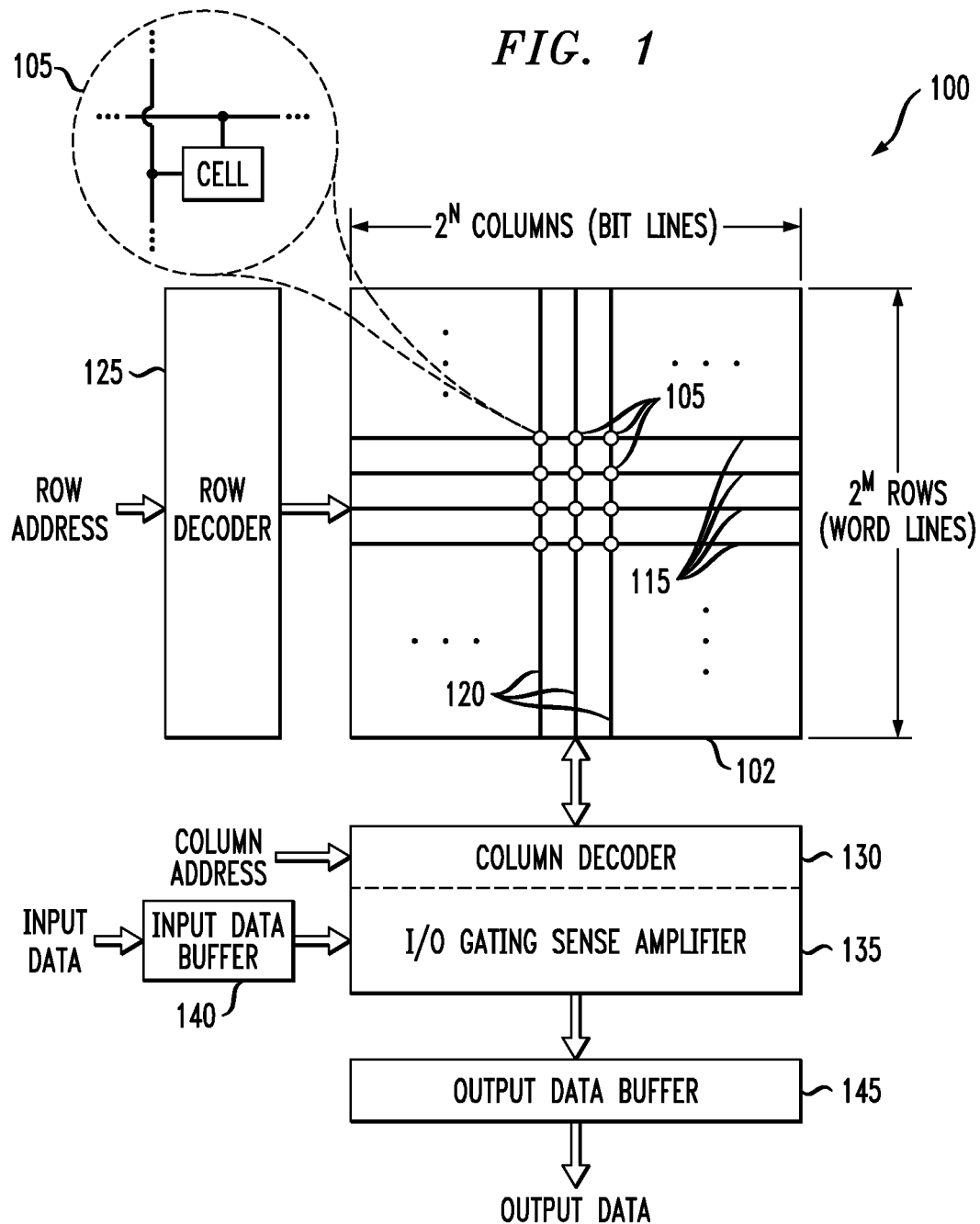
FIG. 1 shows a semiconductor memory device comprising a memory array having a plurality of memory cells each of which incorporates write assist circuitry in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store data. For example, the memory cells may each be configured to store a single bit of data, and such memory cells are also referred to herein as bit-cells. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

Particular ones of the memory cells 105 of the memory array 102 can be activated for writing data thereto or reading data therefrom by application of appropriate row and column addresses to respective row decoder 125 and column decoder 130. Other elements of the memory device 100 include a gating and sense amplifier element 135, an input data buffer 140 and an output data buffer 145. The operation of memory device elements such as row decoder 125, column decoder 130, gating and sense amplifier 135 and buffers 140, 145 is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the gating and sense amplifier 135, or the input and output data buffers 140 and 145.

It should be noted that the memory device 100 in one or more of the illustrative embodiments is assumed to comprise an SRAM device. However, as indicated previously, the disclosed write assist techniques can be adapted in a straightforward manner for use with other types of memory devices, including, for example, dynamic random access memory (DRAM), electrically erasable programmable ROM (EE-PROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. The invention is thus not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

The present embodiment of memory device 100 is advantageously configured to avoid the drawbacks of conventional practice through the use of improved write assist circuitry implemented in each of the memory cells. As will be described below in conjunction with FIGS. 2 through 5, a given memory cell 105 is configured with an enhanced low voltage write capability that does not require negative bootstrapping or charge pumps.

Figure 2:
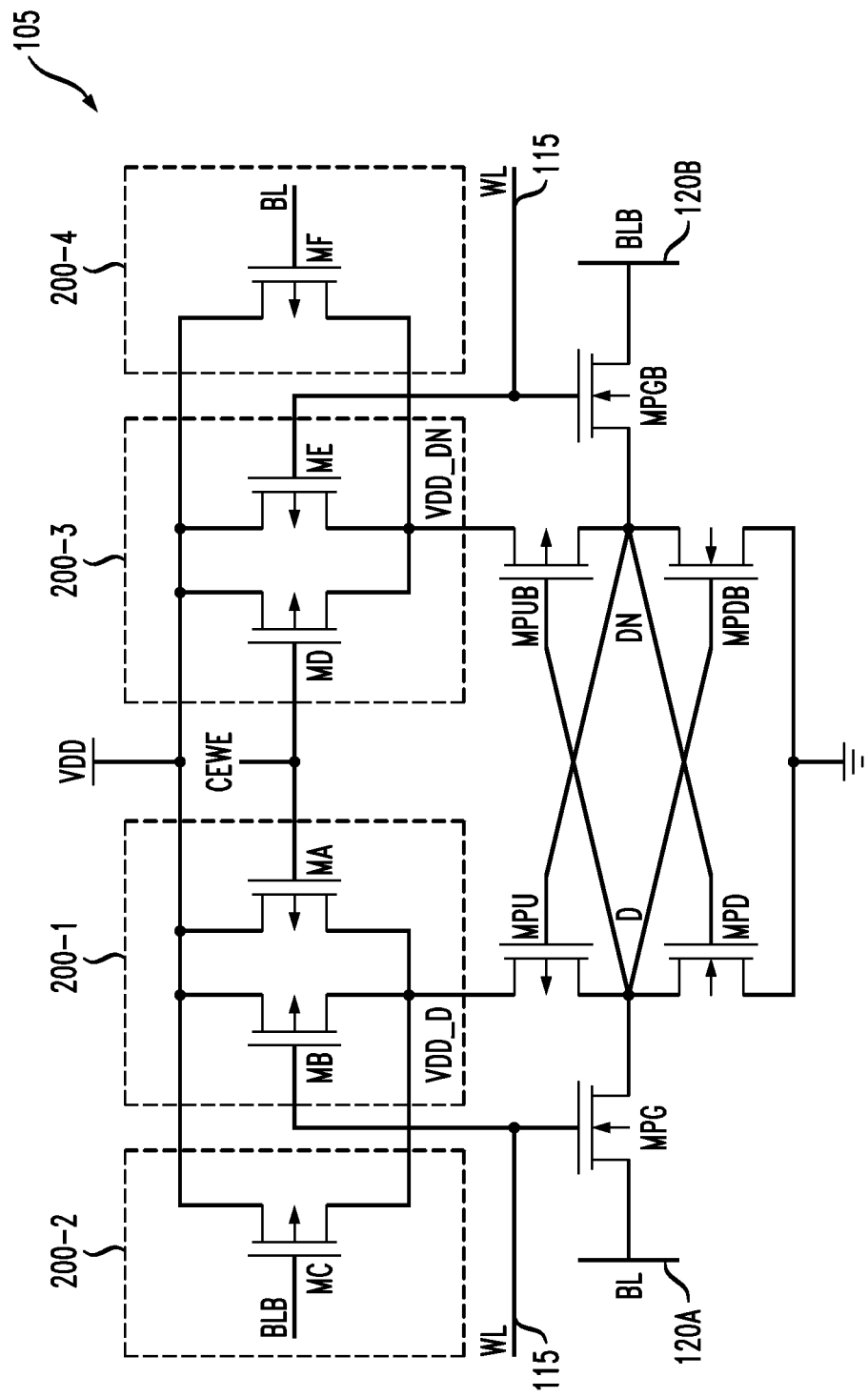
FIG. 2 is a more detailed view showing one possible implementation of a given one of the memory cells in the memory array of the semiconductor memory device of FIG. 1.

FIG. 2 shows the configuration of a given memory cell 105 of the memory array 102. The memory cell 105 in this embodiment is in the form of an SRAM cell that includes a pair of cross-coupled inverters and NMOS pass gate transistors MPG and MPGB. The pair of cross-coupled inverters more specifically comprises a first inverter comprising PMOS pull-up transistor MPU and NMOS pull-down transistor MPD, and a second inverter comprising PMOS pull-up transistor MPUB and NMOS pull-down transistor MPDB. The first and second inverters are also referred to herein as feed-forward and feed-back inverters, respectively, of the memory cell 105. The SRAM cell further comprises write assist circuitry 200. The write assist circuitry 200 includes four separate portions denoted 200-1, 200-2, 200-3 and 200-4. These portions collectively comprise six PMOS transistors denoted MA, MB, MC, MD, ME and MF.

The bitline 120 coupled to memory cell 105 more specifically comprises uncomplemented and complemented bitlines 120A and 120B, also denoted BL and BLB in the figure. The pass gate transistor MPG has its source and drain terminals coupled between BL and node D of the cross-coupled inverters, and its gate terminal coupled to wordline 115, which is also denoted WL in the figure. Similarly, the pass gate transistor MPGB has its source and drain terminals coupled between BLB and node DN of the cross-coupled inverters, and its gate terminal coupled to WL.

The first portion 200-1 of the write assist circuitry comprises PMOS transistors MA and MB connected in parallel with one another, with their respective source and drain terminals coupled between supply voltage VDD and node VDD_D. The gate of transistor MA is coupled to an exemplary control signal terminal denoted in this embodiment as column enable write enable (CEWE), and the gate of transistor MB is coupled to WL. Transistor MC in the second portion 200-2 of the write assist circuitry is connected in parallel with transistors MA and MB, with its source and drain terminals also coupled between supply voltage VDD and node VDD_D. The gate of transistor MC is coupled to BLB.

Portions 200-3 and 200-4 of the write assist circuitry are configured in a manner similar to portions 200-1 and 200-2 as described above. More particularly, the third portion 200-3 of the write assist circuitry comprises PMOS transistors MD and ME connected in parallel with one another, with their respective source and drain terminals coupled between supply voltage VDD and node VDD_DN. The gate of transistor MD is coupled to the control signal terminal CEWE, and the gate of transistor ME is coupled to WL. Transistor MF in the fourth portion 200-4 of the write assist circuitry is connected in parallel with transistors MD and ME, with its source and drain terminals also coupled between supply voltage VDD and node VDD_DN. The gate of transistor MF is coupled to BL.

The source terminals of PMOS pull-up transistors MPU and MPUB are coupled to the respective nodes VDD_D and VDD_DN. The drain terminals of MPU and MPUB are coupled to the respective drain terminals of NMOS pull-down transistors MPD and MPDB at respective nodes D and DN. The source terminals of MPD and MPDB are coupled to ground potential. The cross-coupling of the first inverter comprising MPU and MPD with the second inverter comprising MPUB and MPDB is implemented by coupling the gates of transistors MPU and MPD to node DN and the gates of transistors MPUB and MPDB to node D.

Figure 8:
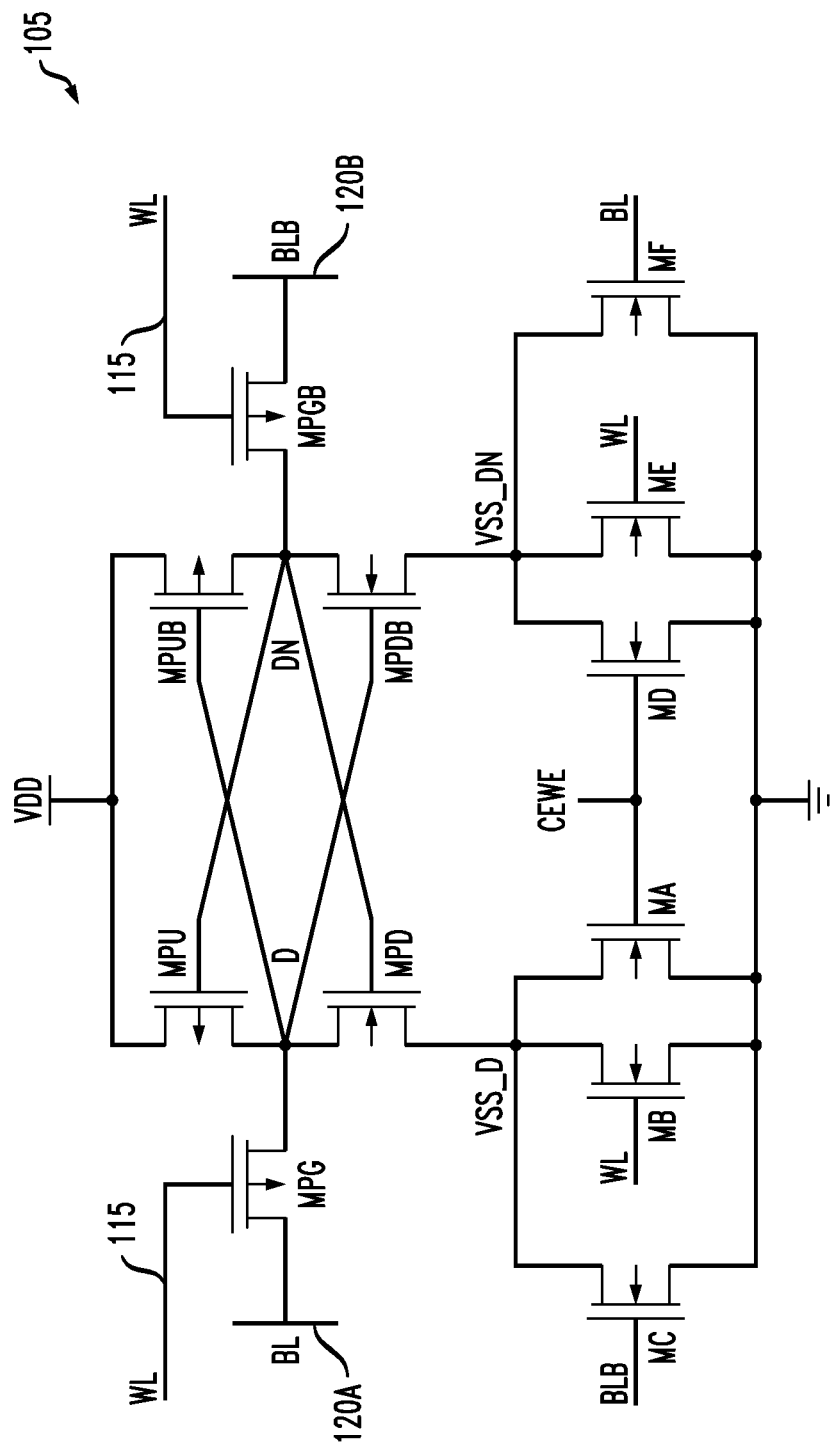
FIG. 8 shows an alternative implementation of a given one of the memory cells in the memory array of the semiconductor memory device of FIG. 1.

The supply voltage VDD and ground potential in the FIG. 2 embodiment are examples of what are more generally referred to herein as supply nodes of the memory cell 105, and are to be distinguished from internal supply nodes such as VDD_D and VDD_DN. For example, the memory cell supply node VDD is separated from the internal supply nodes VDD_D and VDD_DN of respective pull-up transistors MPU and MPUB by transistors of the write assist circuitry. Similarly, in the alternative FIG. 8 memory cell embodiment to be described below, the memory cell supply node given by ground potential or VSS is separated from internal supply nodes VSS_D and VSS_DN of respective pull-down transistors MPD and MPDB by transistors of the write assist circuitry. The memory cell power supply nodes VDD and ground potential (or VSS) are also referred to herein as respective upper and lower power supply nodes of the memory cell.

The memory cell 105 as shown in FIG. 2 can be configured to perform a number of different types of operations, including, by way of example, a write operation without the use of a bit-write mask, a write operation with the use of a bit-write mask, and a read operation. The configuration of the memory cell 105 in these exemplary operations will be described below with reference to FIGS. 3, 4 and 5, respectively.

Figure 3:
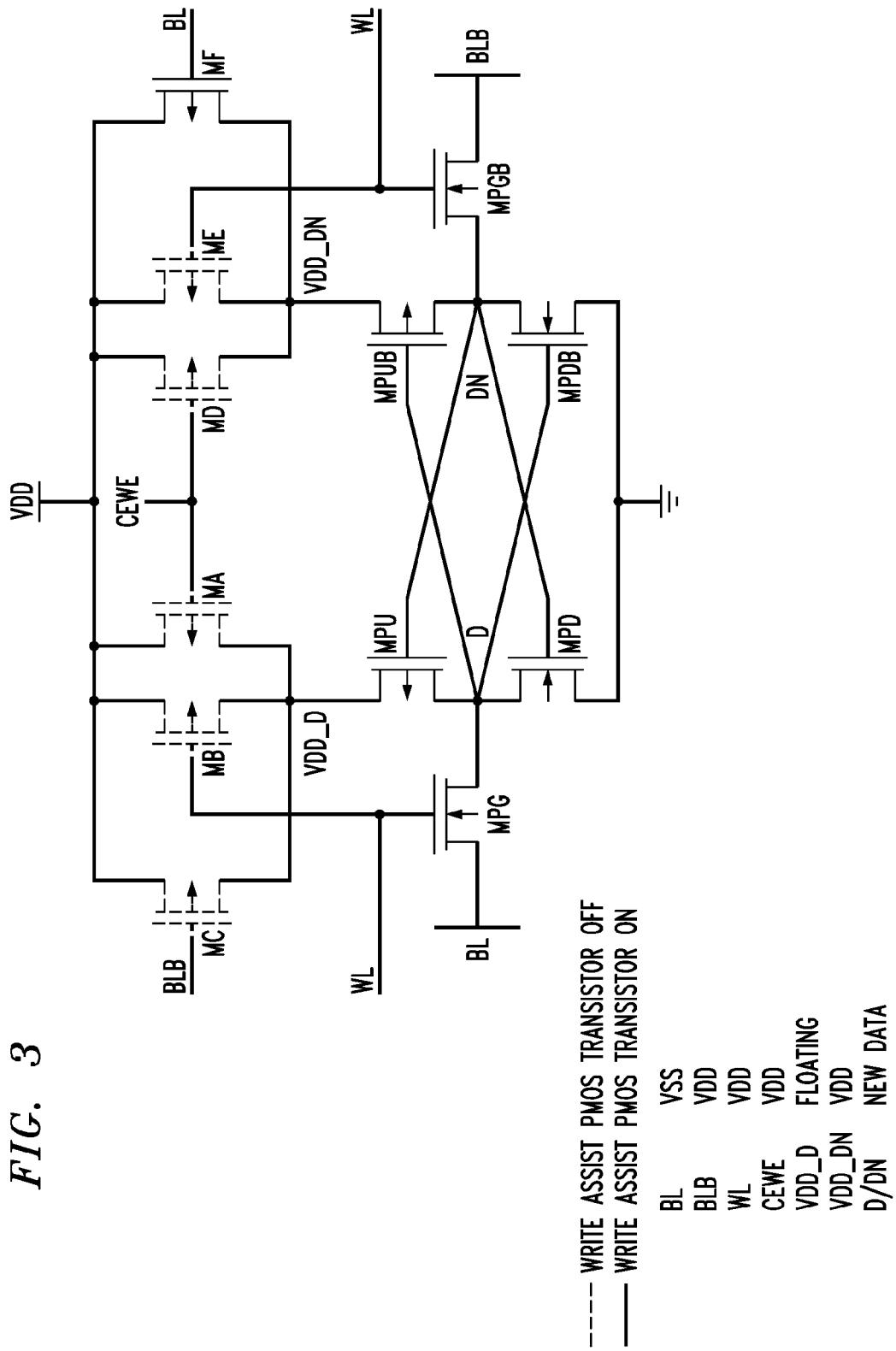
FIG. 3 illustrates the configuration of the memory cell of FIG. 2 for a write operation without the use of a bit-write mask.

Referring now to FIG. 3, the configuration of the memory cell 105 is shown for the write operation without use of the bit-write mask. The states of the respective PMOS transistors MA through MF of the write assist circuitry are indicated by whether those devices are shown in dashed or solid lines, with the use of dashed lines for a given PMOS transistor indicating that the device is cut off (i.e., in its non-conducting or off state), and the use of solid lines for a given PMOS transistor indicating that the device is turned on (i.e., in its conducting or on state).

Prior to initiating a given write operation involving the memory cell 105, BL and BLB are precharged to VDD, and WL and CEWE are set to VSS. This ensures that the internal power supply nodes VDD_D and VDD_DN will both settle to VDD through the corresponding parallel combinations of PMOS transistors MA-MB and MD-ME, respectively, which are all initially in their on states. Transistors MC and MF, which have their gates coupled to BLB and BL, respectively, are initially in their off states. The internal power supply nodes VDD_D and VDD_DN are examples of what are more generally referred to herein as supply nodes associated with respective pull-up devices of a pair of cross-coupled inverters.

During the write operation illustrated in FIG. 3, BL is discharged to VSS while BLB is retained at VDD. After BL discharges to VSS, CEWE and WL are set to VDD. This turns off parallel transistors MA-MB and MD-ME as shown in the figure. Transistor MC remains in its off state as shown since BLB is set to VDD. Transistor MF is turned on as shown in the figure since BL is now at VSS. This connects internal power supply node VDD_DN to VDD through transistor MF. The other internal power supply node VDD_D is floating since transistors MA through ME are off. As a result, static current through the PMOS pull-up transistor MPU is negligible during the write operation, regardless of local variations in PMOS pull-up transistor and NMOS pass gate transistor threshold voltages. This ensures that the NMOS pass gate transistor MPG will be able to drive node D below the trip point of the inverter comprising MPUB and MPDB even with minimal drive current.

Once node D is below the trip point, MPUB turns on and charges node DN to VDD through transistor MF. Nodes D and DN therefore reflect the new data written to the memory cell via pass gate transistor MPG. These nodes D and DN are examples of what are more generally referred to herein as respective uncomplemented and complemented internal data nodes. Since internal power supply node VDD_DN is set to VDD prior to initiating the write operation, node DN will recover to VDD within a short time. Also, since internal power supply node VDD_D node is floating, node D discharges below the trip point of the inverter within a predictable duration, and this predictability can be used to minimize wordline pulse width and thereby improve write cycle time (i.e., the time duration of the write operation).

Figure 4:
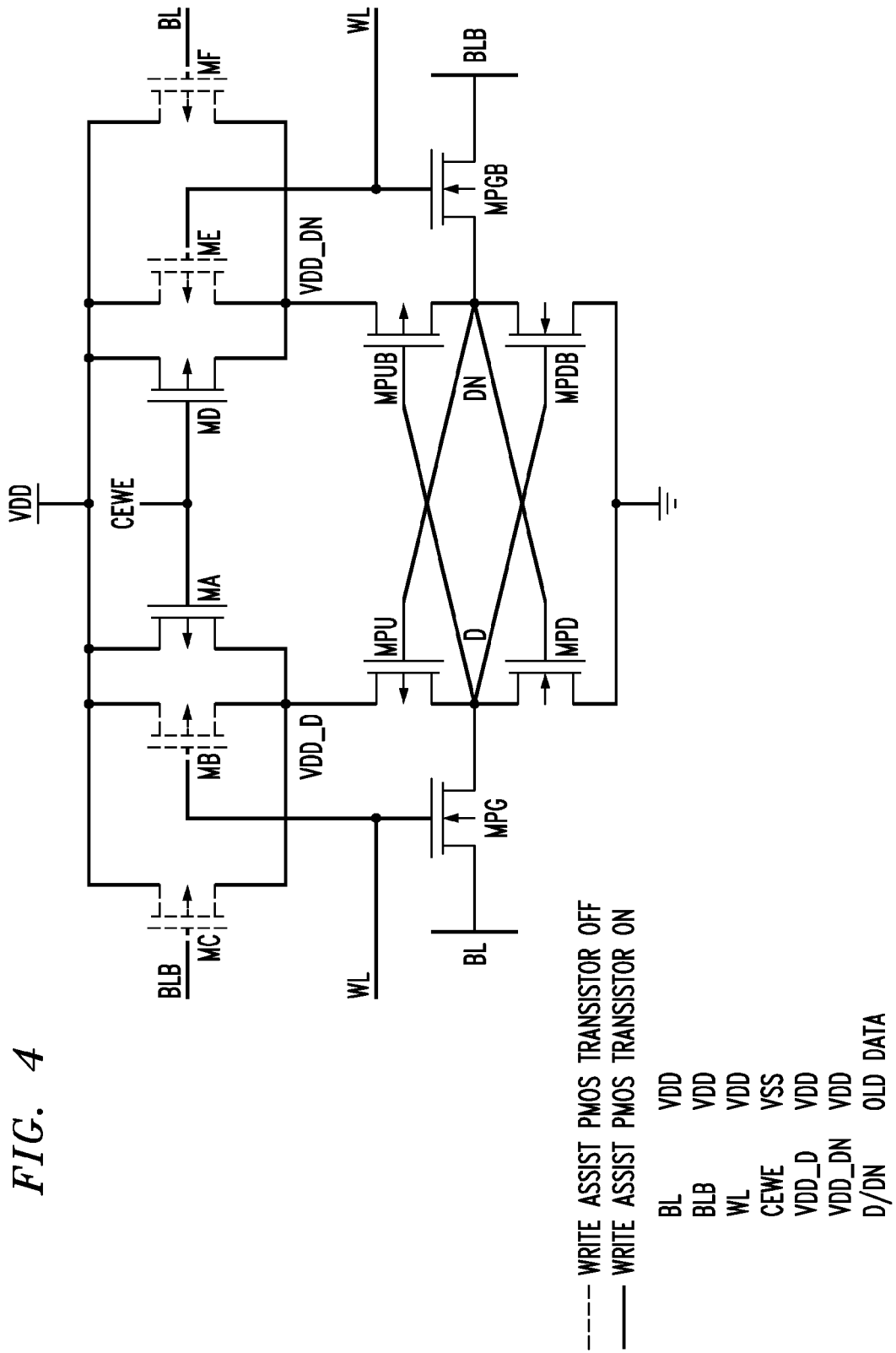
FIG. 4 illustrates the configuration of the memory cell of FIG. 2 for a write operation with the use of a bit-write mask.

FIG. 4 shows the configuration of the memory cell 105 for the write operation with use of the bit-write mask. In this operation, the memory cell is being masked from write. The states of the PMOS transistors MA through MF prior to initiation of the write operation are as described previously. During the bit-write mask operation illustrated in FIG. 4, CEWE is set to VSS which turns on transistors MA and MD as shown, connecting nodes VDD_D and VDD_DN to VDD, WL is enabled which turns off transistors MB and ME as shown, and BL and BLB are both released from precharge, causing in effect a dummy read which masks the write operation and does not disturb the data stored in the memory cell. Nodes D and DN therefore continue to reflect the old data previously stored in the memory cell.

Figure 5:
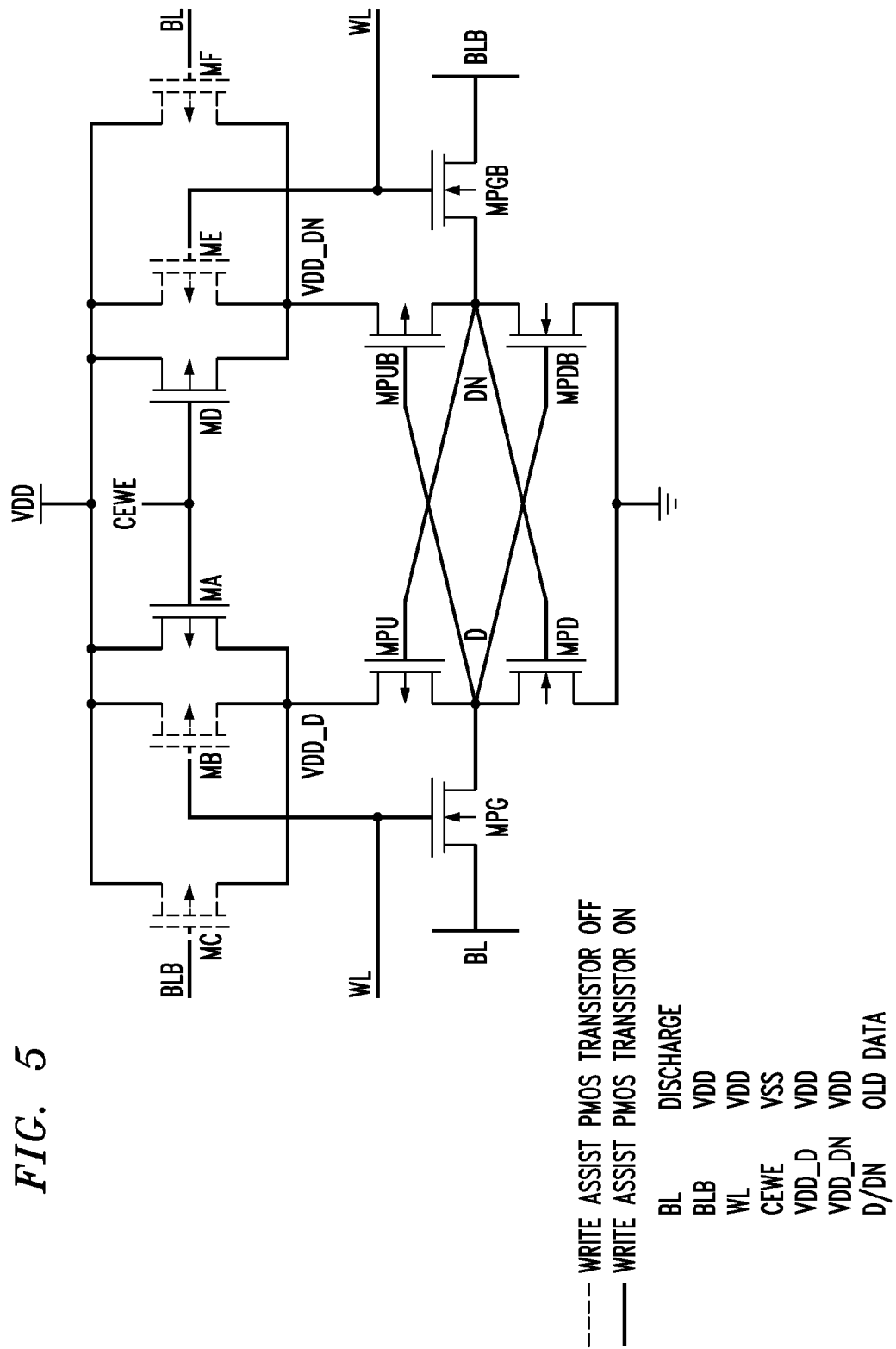
FIG. 5 illustrates the configuration of the memory cell of FIG. 2 for a read operation.

FIG. 5 shows the configuration of the memory cell 105 for the read operation. During the read operation, CEWE is set to VS S which turns on transistors MA and MD as shown, connecting nodes VDD_D and VDD_DN to VDD. WL is enabled which turns off transistors MB and ME as shown. BL and BLB are both released from precharge, such that BL discharges while BLB remains at VDD. The discharged voltage level can then be read out through sense amplifier 135 and into output data buffer 145. Again, nodes D and DN therefore continue to reflect the old data previously stored in the memory cell.

The memory cell 105 as described in conjunction with FIGS. 2 through 5 above provides a number of advantages relative to conventional arrangements. As indicated previously, this memory cell has an enhanced low voltage write capability that does not require negative bootstrapping or charge pumps. Also, this low voltage write capability is provided without adversely impacting high voltage write operations, read operations, or static noise margin. Furthermore, write cycle time can be reduced by reducing wordline pulse width. The yield of a memory array comprising such cells is also improved.

It should be noted that use of PMOS transistors and NMOS transistors in the particular embodiment of the memory cell 105 as described above is by way of illustrative example. In other embodiments, the conductivity types of certain ones of the various transistors may be reversed, as would be appreciated by one skilled in the art. As a more particular example, the PMOS transistors of the write assist circuitry may be replaced with NMOS transistors and the NMOS pass gate transistors may be replaced with PMOS pass gate transistors. An alternative arrangement of this type will be described in more detail below in conjunction with FIG. 8.

A given memory device configured in accordance with the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), field-programmable gate array (FPGA) or other type of processor or integrated circuit device.

Figure 6:
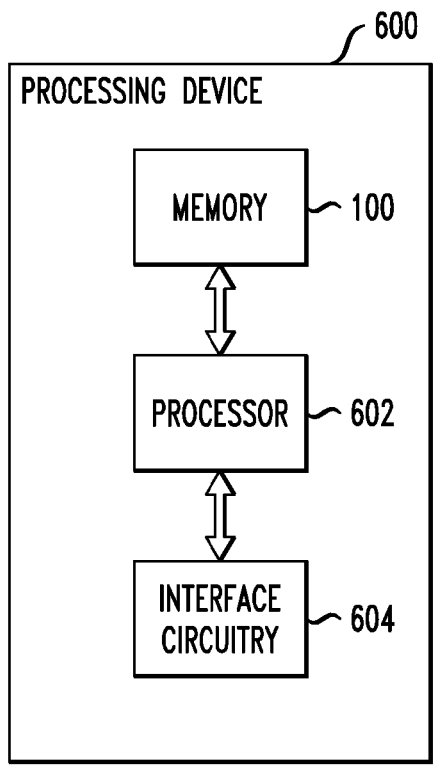
FIG. 6 is a block diagram of a processing device which incorporates the memory device of FIG. 1

FIG. 6 shows an example of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
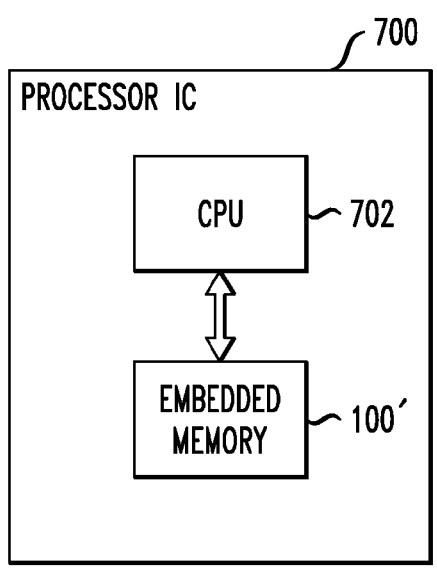
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

As indicated above, alternative memory cells 105 may be used in other embodiments. One example of such an alternative memory cell arrangement will now be described with reference to FIG. 8. In this embodiment, the memory cell 105 is in the form of an SRAM cell that includes PMOS pass gate transistors MPG and MPGB, and NMOS write assist circuitry transistors MA, MB, MC, MD, ME and MF. Thus, the NMOS pass gate transistors of FIG. 2 have been replaced in this embodiment with PMOS devices, and the PMOS write assist transistors of FIG. 2 have been replaced in this embodiment with NMOS devices. The pair of cross-coupled inverters in the FIG. 8 memory cell is the same as that in the FIG. 2 memory cell, with a first inverter comprising PMOS pull-up transistor MPU and NMOS pull-down transistor MPD, and a second inverter comprising PMOS pull-up transistor MPUB and NMOS pull-down transistor MPDB. The write assist transistors MA, MB and MC are coupled between supply node VSS_D of pull-down transistor MPD and ground potential, and the write assist transistors MD, ME and MF are coupled between supply node VSS_DN of pull-down transistor MPDB and ground potential. The operation of the FIG. 8 memory cell 105 is otherwise generally analogous to that of the FIG. 2 memory cell as previously described.

Again, it should be emphasized that the above-described embodiments of the invention are intended to be illustrative only. For example, other embodiments can use different types and arrangements of memory arrays, memory cell circuitry, write assist circuitry, transistor conductivity types, control signals, and other elements for implementing the described functionality. These and numerous other alternative embodiments within the scope of the following claims will be apparent to those skilled in the art.

What is claimed is:

1. A memory device comprising:
a memory array comprising a plurality of memory cells;
at least a given one of the memory cells comprising:
a pair of cross-coupled inverters; and
write assist circuitry;
the write assist circuitry comprising:
first switching circuitry coupled between a supply node of a device of the first inverter and a supply node of the memory cell; and
second switching circuitry coupled between a supply node of a device of the second inverter and the supply node of the memory cell;
wherein each of the first and second switching circuitry comprise at least first, second and third write assist transistors;
wherein the first, second and third write assist transistors of the first switching circuitry are controlled using a common control signal, a worldline and a complemented bitline of the memory device, respectively, and the first, second and third write assist transistors of the second switching circuitry are controlled using the common control signal, the wordline and an uncomplemented bitline of the memory device, respectively; and
wherein the first and second switching circuitry are separately controlled such that during a write operation of the memory cell the supply node of one of the devices is connected to the supply node of the memory cell while the supply node of the other device is not connected to the supply node of the memory cell but is instead permitted to float.

2. The memory device of claim 1 wherein the first switching circuitry is coupled between a supply node of a pull-up device of the first inverter and an upper power supply node of the memory cell, the second switching circuitry is coupled between a supply node of a pull-up device of the second inverter and the upper power supply node of the memory cell, and the first and second switching circuitry are separately controlled such that during a write operation of the memory cell the supply node of one of the pull-up devices is connected to the upper power supply node while the supply node of the other pull-up device is not connected to the upper power supply node but is instead permitted to float.

3. The memory device of claim 2 wherein the pull-up devices of the first and second inverters comprise respective pull-up transistors and the first and second inverters further comprise respective pull-down transistors.

4. The memory device of claim 3 wherein the memory cell further comprises first and second pass gate transistors.

5. The memory device of claim 4 wherein:
the first pass gate transistor has its source and drain terminals coupled between an uncomplemented bitline and an uncomplemented internal data node of the memory cell and its gate terminal coupled to a wordline; and
the second pass gate transistor has its source and drain terminals coupled between a complemented bitline and a complemented internal data node of the memory cell and its gate terminal coupled to the wordline.

6. The memory device of claim 5 wherein source terminals of the pull-up transistors are coupled to respective ones of the device supply nodes, drain terminals of the pull-up transistors are coupled to respective drain terminals of the pull-down transistors at the uncomplemented and complemented internal data nodes, source terminals of the pull-down transistors are coupled to ground potential, and the first inverter is cross-coupled to the second inverter by coupling gates of the pull-up and pull-down transistors of the first inverter to the complemented internal data node and gates of the pull-up and pull-down transistors of the second inverter to the uncomplemented internal data node.

7. The memory device of claim 1 wherein the first switching circuitry is coupled between a supply node of a pull-down device of the first inverter and a lower power supply node of the memory cell, the second switching circuitry is coupled between a supply node of a pull-down device of the second inverter and the lower power supply node of the memory cell, and the first and second switching circuitry are separately controlled such that during a write operation of the memory cell the supply node of one of the pull-down devices is connected to the lower power supply node while the supply node of the other pull-down device is not connected to the lower power supply node but is instead permitted to float.

8. The memory device of claim 1 wherein:
the first, second and third write assist transistors of the first switching circuitry are connected in parallel with one another with their source and drain terminals coupled between the supply node of the device of the first inverter and the supply node of the memory cell; and
the first, second and third write assist transistors of the second switching circuitry are connected in parallel with one another with their source and drain terminals coupled between the supply node of the device of the second inverter and the supply node of the memory cell.

9. The memory device of claim 8 wherein the first, second and third write assist transistors of the first and second switching circuitry are PMOS transistors.

10. The memory device of claim 8 wherein gate terminals of the first write assist transistor of the first switching circuitry and the first write assist transistor of the second switching circuitry are coupled to a common control signal terminal.

11. The memory device of claim 10 wherein gate terminals of the second write assist transistor of the first switching circuitry and the second write assist transistor of the second switching circuitry are coupled to a common wordline.

12. The memory device of claim 11 wherein gate terminals of the third write assist transistor of the first switching circuitry and the third write assist transistor of the second switching circuitry are coupled to respective complemented and uncomplemented bitlines.

13. The memory device of claim 12 wherein during said write operation the first and second write assist transistors of the first and second switching circuitry are in their respective off states, the third write assist transistor of the first switching circuitry is in its off state, and the third write assist transistor of the second switching circuitry is in its on state, such that the supply node of the device of the second inverter is connected to the supply node of the memory cell by the third write assist transistor of the second switching circuitry, while the supply node of the device of the first inverter is disconnected from the supply node of the memory cell by the third write assist transistor of the first switching circuitry.

14. An integrated circuit comprising the memory device of claim 1.

15. A processing device comprising the memory device of claim 1.

16. A memory cell comprising:
a pair of cross-coupled inverters; and
write assist circuitry;
the write assist circuitry comprising:
first switching circuitry coupled between a supply node of a device of the first inverter and a supply node of the memory cell; and
second switching circuitry coupled between a supply node of a device of the second inverter and the supply node of the memory cell;
wherein each of the first and second switching circuitry comprise at least first, second and third write assist transistors;
wherein the first, second and third write assist transistors of the first switching circuitry are controlled using a common control signal, a wordline and a complemented bitline of a memory device, respectively, and the first, second and third write assist transistors of the second switching circuitry are controlled using the common control signal, the wordline and an uncomplemented bitline of the memory device, respectively; and
wherein the first and second switching circuitry are separately controlled such that during a write operation of the memory cell the supply node of one of the devices is connected to the supply node of the memory cell while the supply node of the other device is not connected to the supply node of the memory cell but is instead permitted to float.

17. The memory cell of claim 16 wherein:
the first, second and third write assist transistors of the first switching circuitry are connected in parallel with one another with their source and drain terminals coupled between the supply node of the device of the first inverter and the supply node of the memory cell; and
the first, second and third write assist transistors of the second switching circuitry are connected in parallel with one another with their source and drain terminals coupled between the supply node of the device of the second inverter and the supply node of the memory cell.

18. A method comprising:
providing a memory cell comprising a pair of cross-coupled inverters and associated write assist circuitry, the write assist circuitry comprising first and second switching circuitry, each switching circuitry comprising at least first, second and third write assist transistors; and
during a write operation of the memory cell, configuring the write assist circuitry to connect a supply node of a device of one of the inverters to a supply node of the memory cell, by turning on at least one of the first, second and third write assist transistors of one of the first switching circuitry and the second switching circuitry while a supply node of a device of another one of the inverters is not connected to the supply node of the memory cell but is instead permitted to float, by turning off the first, second and third write assist transistors of the other one of the first switching circuitry and the second switching circuitry;
wherein the first, second and third write assist transistors of the first switching circuitry are controlled using a common control signal, a wordline and a complemented bitline of a memory device, respectively, and the first, second and third write assist transistors of the second switching circuitry are controlled using the common control signal, the wordline and an uncomplemented bitline of the memory device, respectively.

19. The method of claim 18 wherein:
the first, second and third write assist transistors of the first switching circuitry are connected in parallel with one another with their source and drain terminals coupled between the supply node of the device of one of the inverters and the supply node of the memory cell; and
the first, second and third write assist transistors of the second switching circuitry are connected in parallel with one another with their source and drain terminals coupled between the supply node of the device of the other inverter and the supply node of the memory cell.

20. The method of claim 19 wherein the configuring step further comprises the steps of:
applying a common control signal to respective gates of the first write assist transistors in each of the first and second switching circuitry;
coupling respective gates of the second write assist transistors in each of the first and second switching circuitry to a common wordline; and
coupling respective gates of the third write assist transistors in each of the first and second switching circuitry to respective complemented and uncomplemented bitlines.

* * * * *